(12) United States Patent
Saito et al.

(10) Patent No.: US 8,362,698 B2
(45) Date of Patent: Jan. 29, 2013

(54) ORGANIC EL PANEL AND ITS MANUFACTURING METHOD

(75) Inventors: Yuji Saito, Yamagata-ken (JP); Shinji Nakajima, Yamagata (JP); Toshinao Yuki, Yamagata-ken (JP)

(73) Assignees: Tohoku Pioneer Corporation, Yamagata (JP); Pioneer Corporation, Tokyo (JP)

( * ) Notice: Subject to any disclaimer, the term of this patent is extended or adjusted under 35 U.S.C. 154(b) by 328 days.

(21) Appl. No.: 12/919,599

(22) PCT Filed: Feb. 26, 2008

(86) PCT No.: PCT/JP2008/053293
§ 371 (c)(1),
(2), (4) Date: Aug. 26, 2010

(87) PCT Pub. No.: WO2009/107201
PCT Pub. Date: Sep. 3, 2009

(65) Prior Publication Data
US 2010/0327275 A1    Dec. 30, 2010

(51) Int. Cl.
*H01L 51/50* (2006.01)
(52) U.S. Cl. .......... 313/512; 313/504; 313/506; 445/25; 445/24; 257/100
(58) Field of Classification Search ............ 313/512, 313/504, 506; 445/24, 25; 257/100; 438/106, 438/115, 118, 126
See application file for complete search history.

(56) References Cited

U.S. PATENT DOCUMENTS

| | | | | |
|---|---|---|---|---|
| 6,114,715 | A | * | 9/2000 | Hamada .......................... 257/72 |
| 6,930,449 | B2 | * | 8/2005 | Sasatani et al. ............... 313/512 |
| 6,992,439 | B2 | * | 1/2006 | Yamazaki et al. ............ 313/512 |
| 7,097,527 | B2 | * | 8/2006 | Matsuoka ....................... 445/25 |
| 8,018,147 | B2 | * | 9/2011 | Hung et al. ................... 313/506 |
| 2003/0067268 | A1 | * | 4/2003 | Matsuoka ...................... 313/512 |
| 2004/0081852 | A1 | * | 4/2004 | Chen et al. .................... 428/690 |
| 2005/0104513 | A1 | * | 5/2005 | Lee et al. ...................... 313/506 |
| 2006/0199461 | A1 | * | 9/2006 | Yamazaki et al. ............. 445/24 |
| 2007/0278950 | A1 | * | 12/2007 | Hu et al. ....................... 313/512 |
| 2008/0238303 | A1 | * | 10/2008 | Lee et al. ...................... 313/504 |

FOREIGN PATENT DOCUMENTS

| | | |
|---|---|---|
| JP | 2000-223265 A | 8/2000 |
| JP | 2002-324666 A | 11/2002 |
| JP | 2003-317936 A | 11/2003 |
| JP | 2004-119259 A | 4/2004 |
| JP | 2004-146353 A | 5/2004 |

OTHER PUBLICATIONS

International Search Report w/translation from PCT/JP2008/053293 dated May 20, 2008 (4 pages).

* cited by examiner

*Primary Examiner* — Mary Ellen Bowman
(74) *Attorney, Agent, or Firm* — Osha Liang LLP

(57) ABSTRACT

An organic EL panel includes a light-emitting part including one or a plurality of organic EL elements on a substrate and having a sealing structure sealing the light-emitting part. The organic EL element includes a light-emitting layer, an organic layer formed on a first electrode formed directly, or via another layer, on the substrate, and a second electrode formed on the organic layer. The organic EL panel includes a coating film formed on the substrate, directly at least on the second electrode, so as to coat the light-emitting part. The coating film is made of an amorphous organic material and has a thickness absorbing a surface irregularity of the contact object contacted by the surface of the coating film.

4 Claims, 7 Drawing Sheets

10

10A

10C

10D

500E (BB)

ORGANIC EL PANEL AND ITS MANUFACTURING METHOD

CONTINUITY DATA

This Application is a national stage entry of PCT/JP2008/053293, filed Feb. 26, 2008. Said application is incorporated herein by reference in its entirety.

FIELD OF INVENTION

The present invention relates to organic EL panels and methods for manufacturing the same.

BACKGROUND OF THE INVENTION

An organic EL (electroluminescence) panel includes an organic EL element as light-emitting element and is a self light-emitting panel that can be applied to various usages such as various indication devices, for example, as indicator display of cellular phone, monitor display for automotive and home electronic devices, information indication display of personal computer and television device, etc.; various light sources, for example, scanner and printer, etc.; lighting devices, for example, general lights, backlight for liquid crystal indication devices, etc.; optical communication device using opto-electronic transformation function, etc.

An organic EL element is as nature subject to deterioration of luminescence characteristic when in contact with water, etc. contained in the air. Therefore, a sealing structure is inevitable to block air from the organic EL element for a stable and long operation of the organic EL panel. As a generally adopted sealing structure for organic EL panel, a sealing member made of metal or glass and a substrate on which the organic EL element is formed are bonded so as to form a sealing space encapsulating the organic EL element to house a desiccant in the sealing space (hollow-sealed structure). Also, in view of still thinner panels or improved strength, an investigation on a solid sealing structure is in progress for coating the organic EL element directly with a sealing material without space.

According to the conventional art described in patent literature 1, there are included a first substrate including an organic EL element on the surface, a second substrate bonded with the first substrate, and a desiccant layer formed on the surface of the second substrate, wherein the surface of the desiccant layer is coated with a stress buffer layer made of a resin layer.

[Patent Literature 1] Japanese Unexamined Patent Application Publication 2003-317936

SUMMARY OF THE INVENTION

In the organic EL panel that adopted the above-mentioned hollow-sealed structure, the presence of the sealing space largely influences the thickness of the panel, requiring the gap of the sealing space to be made small. In such a case, a deformation of the substrate or the sealing member may cause the inner surface of the sealing member or the desiccant layer housed on the inner surface of the sealing member to come into contact with the organic EL element on the substrate.

A desiccant layer including a binder resin and a desiccant component of an inorganic material is used. As the desiccant component of an inorganic material is in form of particles or grains, microscopic irregularities are formed on the surface of the desiccant layer. Therefore, the organic EL element, when contacted by this surface, may be mechanically damaged, causing a deterioration that causes a luminescent defect such as leak. In the above-mentioned conventional art (patent literature 1), in order to solve this deterioration, the desiccant layer is coated by a stress buffer layer made of a resin layer such that the surface irregularities of desiccant layer do not directly contact the organic EL element.

However, in this conventional art, the substrate on the surface of which the organic EL element is formed (first substrate) is transferred from a film formation chamber to a sealing process chamber, while the sealing member on which a desiccant layer and a stress buffer layer that covers the desiccant layer are formed (second substrate) is transferred to the sealing process chamber via another atmosphere than the above-mentioned film formation chamber. Therefore, dusts, etc. may be adsorbed on the surface of the stress buffer layer during the transfer step. In such a case, disadvantageously, the adsorbed dusts, etc. may damage the organic EL element when the surface contacts the surface of the organic EL element even if a stress buffer layer provided.

In addition, in the above-mentioned conventional art, the desiccant layer is coated with a stress buffer layer made of a resin layer. Therefore, the moisture that has penetrated into the sealing space can only be absorbed through the resin layer. Consequently, as a problem, the essential function of the desiccant layer to absorb the moisture penetrated into the sealing space may be lowered.

On the other hand, when adopting the solid sealing structure, a sealing adhesive layer contacts the surface of the organic EL element. In order to improve the adhesive strength and the strength of the entire panel thereby, filler may be mixed in the sealing adhesive. A problem of this case is that the surface irregularities due to the presence of aggregate contacts the surface of organic EL element and may mechanically damage the organic EL element, too.

The present invention is provided to treat such issues. It is an object of the present invention, for achieving a thinner panel, not to mechanically damage the organic EL element. It is a further object of the present invention to improve the mechanical strength of the panel itself, and so on. Specifically, it is another object of the present of the invention, for an organic EL panel formed by bonding a substrate on which an organic EL element is formed and a sealing member, to achieve a thinner panel. It is still another object of the present invention to prevent a desiccant housed on the inner surface of the sealing member from contacting the surface of the organic EL element. It is further another object of the present invention to maintain the good luminescence characteristic of the organic EL panel by maintaining the sufficient moisture absorbing function by the desiccant.

In order to achieve these objects, the organic EL panel and the manufacturing method thereof according to the present invention has at least the following configurations of the respective independent claims.

An organic EL panel comprising a light-emitting part including one or a plurality of organic EL elements on a substrate and having a sealing structure sealing the light-emitting part, wherein said organic EL element includes a light-emitting layer, and includes an organic layer formed on a first electrode formed directly, or via another layer, on said substrate, and a second electrode formed on the organic layer, said organic EL panel includes a coating film coating said light-emitting part and is formed on said substrate, directly at least on said second electrode; said sealing structure is formed by bonding said substrate and a sealing member via an adhesive layer surrounding said light-emitting part; a sheet-shaped desiccant is arranged on an inner surface of said sealing member; said sheet-shaped desiccant includes a desiccant component made of a binder resin and an inorganic material; said desiccant component contacts said coating film, said inorganic material has a convex part formed on the surface of the sheet-shaped desiccant, and the surface of said coating film has a concave part formed by said convex part; said coating film is made of an amorphous organic material and is formed to have a thickness larger than the length of said convex part.

A method for manufacturing an organic EL panel comprising a light-emitting part including one or a plurality of organic EL elements on a substrate and having a sealing structure sealing the light-emitting part, comprising an element-area defining step of forming a first electrode directly, or via another layer, on said substrate and defining an element area on the first electrode; a coating-film forming step of forming a coating film coating said light-emitting part made of an amorphous organic material, on said substrate, a coating-film forming step of forming a coating film coating said light-emitting part made of an amorphous organic material, on said substrate and a sealing step of sealing said light-emitting part, wherein said sealing step includes bonding said substrate and a sealing member having a sheet-shaped desiccant arranged on the inner surface via an adhesive layer surrounding said light-emitting part; said sheet-shaped desiccant includes a desiccant component made of a binder resin and an inorganic material; said desiccant component contacts said coating film; said inorganic material has a convex part formed on the surface of the sheet-shaped desiccant; and the surface of said coating film contacted by said desiccant has a concave part formed by said convex part, said coating-film forming step includes forming said coating film to a thickness larger than the length of said convex part of said sheet-shaped desiccant contacted by a surface of said coating film, without breaking vacuum from said film forming step.

BRIEF DESCRIPTION OF THE DRAWINGS

FIG. 1 illustrates an organic EL panel according to one embodiment of the present invention.

DETAILED DESCRIPTION

Figure 1A:
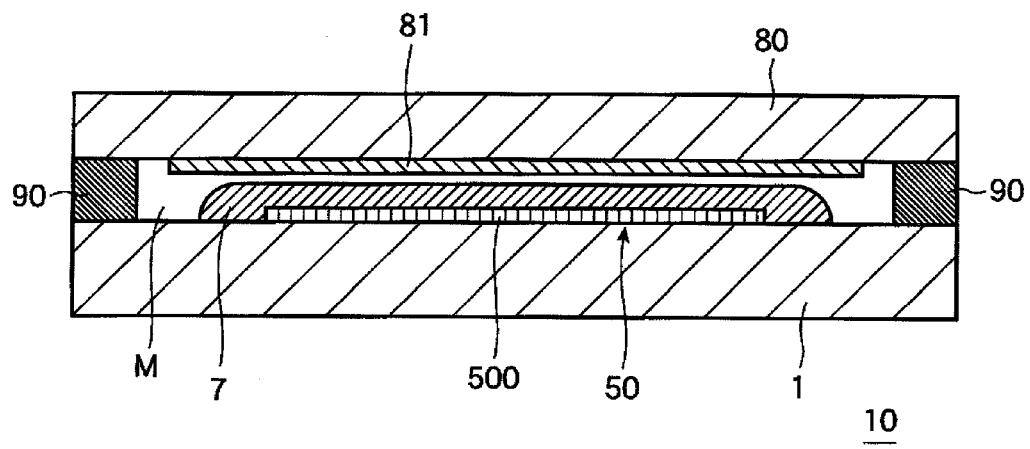
FIG. 1(A) is a cross-sectional view of an organic EL panel 10 according to the first embodiment of the present invention.

An organic EL panel according to one embodiment of the present invention is an organic EL panel that includes a light-emitting part including one or a plurality of organic EL elements on a substrate and having a sealing structure sealing the light-emitting part, wherein the organic EL element includes a light-emitting layer, includes an organic layer formed on a first electrode formed directly, or via another layer, on the substrate, and a second electrode formed on the organic layer, the organic EL panel includes a coating film formed on said substrate, directly at least on said second electrode, so as to coat the light-emitting part; the coating film is made of an amorphous organic material and has a thickness absorbing a surface irregularity of the contact object contacted by the surface of the coating film.

In the above-mentioned organic EL panel, the coating film is directly formed at least on the second electrode and coats the light-emitting part. This coating film is made of an amorphous organic material and has a film thickness that absorbs the surface irregularities of the contact object contacted by the surface of the coating film. Therefore, the mechanical damage to the organic EL element by the surface irregularities of the contact object contacted by the surface of the coating film can be reduced.

Specifically, the mechanical damage to the organic EL element can be reduced since the coating film made of an amorphous organic material functions as a buffer layer that disperses the stress by the contact object (for example, desiccant, etc.).

Especially, in a comparatively thin organic EL panel, for example, in a case of a relatively small distance between the contact object such as desiccant, etc., the mechanical damage to the organic EL element can be reduced since the above-mentioned coating film made of an amorphous organic material is formed on the organic EL element. Preferably, the buffer layer has a high elastic modulus.

In the organic EL panel according to one embodiment of the present invention, the panel itself has relatively high strength since the above-mentioned coating film is formed.

An organic EL panel formed by bonding a substrate on which an organic EL element is formed and a sealing member includes the above-mentioned coating film, thereby achieving a thinner panel and preventing a desiccant arranged on the inner surface of the sealing member from contacting the surface of the organic EL element.

Moreover, in an organic EL panel, in addition to achieving a thinner panel, the organic EL element may not be mechanically damaged, by forming a coating film on the organic EL element and providing a sealing structure covering the sealing member via a sealing adhesive on the coating film.

Furthermore, the good luminescence characteristics of the organic EL panel may be maintained by maintaining the sufficient moisture absorbing function by the desiccant.

A method of manufacturing an organic EL panel according to one embodiment of the present invention is a method of manufacturing an organic EL panel that includes a light-emitting part including one or a plurality of organic EL elements on a substrate and having a sealing structure sealing the light-emitting part. Furthermore, the method of manufacturing an organic EL panel includes an element-area defining step of forming a first electrode directly, or via another layer, on the substrate and defining an element area on the first electrode; a film forming step of forming an organic layer including a light-emitting layer on the first electrode on which the element area is defined and forming a second electrode on the organic layer, in vacuo; a coating-film forming step of forming a coating film coating the light-emitting part made of an amorphous organic material, on the substrate; and a sealing step of sealing the light-emitting part, wherein the coating-film forming step includes forming the coating film to a thickness absorbing a surface irregularity of a contact object contacted by a surface of the coating film, without breaking vacuum from the film forming step.

For example, in an organic EL panel according to conventional art, the desiccant layer provided on the side of the sealing member is covered by a stress buffer layer having a resin layer such that the surface irregularities of the surface of the resin layer do not directly contact the organic EL element. In this conventional art, as mentioned above, dusts, etc. may be adsorbed on the surface of the stress buffer layer during the manufacturing step. In such a case, a problem may occur that the adsorbed dusts, etc. may damage the organic EL element when the surface contacts the surface of the organic EL element even if a stress buffer layer is provided.

The method for manufacturing the organic EL panel according to the present invention includes a coating-film forming step of forming a coating film coating the light-emitting part made of an amorphous organic material, on said substrate, and a sealing step of sealing the light-emitting part, wherein the coating-film forming step includes forming the coating film to a thickness absorbing a surface irregularity of a contact object contacted by a surface of said coating film, without breaking vacuum from said film forming step. Accordingly, the adsorption of dusts, etc. between the coating film and the organic EL element can be reduced, thereby reducing the mechanical damage to the organic EL element.

Hereinafter, embodiments of the present invention will be explained with reference to the drawings.

Figure 1B:
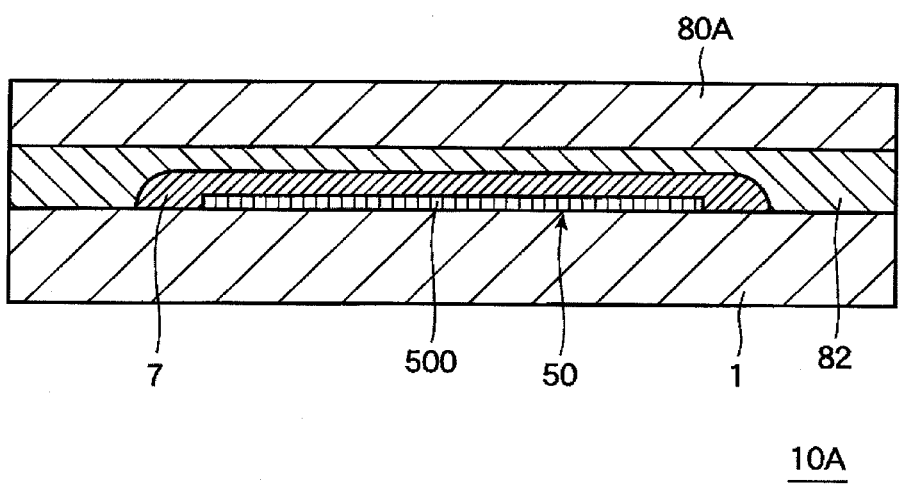
FIG. 1(B) is a cross-sectional view of an organic EL panel 10A according to the second embodiment of the present invention.

FIG. 1 illustrates an organic EL panel according to one embodiment of the present invention. FIG. 1(A) is a cross-sectional view of an organic EL panel 10 according to the first embodiment of the present invention; and FIG. 1(B) is a cross-sectional view of an organic EL panel 10A according to the second embodiment of the present invention.

Figure 2A:
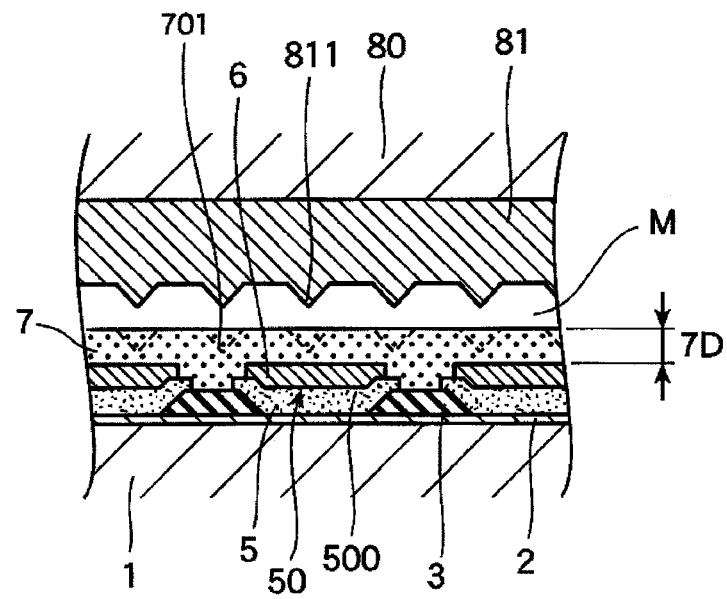
FIG. 2(A) is an enlarged cross-sectional view of the main part of the organic EL panel 10 shown in FIG. 1(A)
Figure 2B:
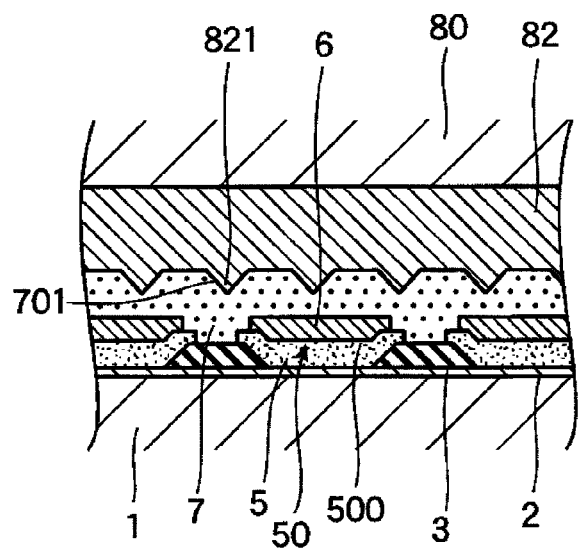
FIG. 2(B) is an enlarged cross-sectional view of the main part of the organic EL panel 10A shown in FIG. 1(B).

FIG. 2(A) is an enlarged cross-sectional view of the main part of the organic EL panel 10 shown in FIG. 1(A); and FIG. 2(B) is an enlarged cross-sectional view of the main part of the organic EL panel 10A shown in FIG. 1(B).

The organic EL panel 10 according to the first embodiment of the present invention includes, as basic configuration, a substrate 1, a first electrode (lower electrode) 2, an insulating layer 3, an organic layer 5, a second electrode (upper electrode) 6, a light-emitting part 50, a coating film 7, a sealing member 80, a desiccant 81, and an adhesive layer 90.

The coating film 7 corresponds to a coating film according to one embodiment of the present invention. The light-emitting part 50 corresponds to a light-emitting part according to one embodiment of the present invention.

The substrate 1 may be formed of glass, etc. In a case of taking out light from the light-emitting part 50 through the substrate 1 (bottom emission type panel), then the substrate 1 is required to be a transparent member. But in a case of taking out light from the opposite side of the substrate 1 (top emission type panel), then the substrate 1 is not required to be a transparent member.

The first electrodes (lower electrode) 2 are formed on the substrate 1, for example, in parallel (in a stripe shape), by using a transparent electrode such as ITO (indium tin oxide), etc. in a case of taking out light through the substrate 1, while a metal electrode having a high reflectance is used in a case of taking out light from the opposite side of the substrate 1.

The insulating film 3 leaves exposed a part of the first electrode 2 on which the light-emitting part 50 is formed and covers the other part, such that the first electrodes 2 are electrically isolated from each other. For example, in a case of forming the light-emitting part 50 in a dot-matrix shape, the first electrode 2 is formed partially on the substrate 1 and partially on the first electrode 2 by covering both sides, such that the exposed part on the first electrode is defined in a grid pattern.

The organic layer 5 is a layer of an organic EL medium layer including a light-emitting layer 5C and formed at least on the electrode 1 that is not covered by the insulating film 3. It also includes the above-mentioned light-emitting layer and each function layer for providing electrons and holes into the light-emitting layer (for example, electron injection-transport layer, hole injection-transport layer, hole-electron blocking layer, hole-electron buffer layer, etc.)

Second electrodes 6 are formed in parallel on the organic layer 5, such as to cross the first electrode 2, thereby sandwiching the organic layer 5 at the crossing part with the electrode 2 and forming the light-emitting part 50 having the organic EL element. A transparent electrode such as ITO, etc, or a thin metal electrode is used in a case of taking out light on the opposite side of the substrate 1, while another metal electrode having a high reflectance is used in a case of taking out light through the substrate 1.

A sealing structure may be formed by bonding a sealing member 80 to the substrate 1 via an adhesive layer 90 surrounding the light-emitting part 50, for example. This sealing member 80 is formed of a glass material, a metal material, etc. and in a plate shape. The adhesive layer 90 is formed of a resin or an inorganic material such as resin or a glass frit, etc.

In the organic EL panel 10 according to the first embodiment shown in FIG. 1(A) and FIG. 2(A), a contact object according to one embodiment of the present invention is a desiccant 81 in a sheet shape housed on the inner surface of the sealing member 80.

The desiccant 81 may be formed in a sheet shape, for example. This desiccant 81 has a structure including a binder resin and a desiccant component. The binder resin is necessary for the sheet-shaped form, and may be a resin material having a chain molecule structure. The desiccant component can be configured by an inorganic material having nature of adsorbing moisture, and dispersed in the binder resin in form of particles.

Preferably, the binder resin does not hinder the moisture adsorbing function of the desiccant component, and may be made of a material of a relatively high gas permeability (gas permeable resin), for example. Specifically, as binder resin, a polymer material such as polyolefinic, polyacrylic, polyacrylo-nitrilic, polyamidic, polyester, epoxy, polycarbonate polymer, and the like, may be used. Among these, a polyolefinic gas permeable resin may be preferred due to its relatively high gas permeability. Specifically, the binder resin may be a polyethylene, polypropylene, polybutadiene, polyisoprene, a copolymer of these, or the like. Preferably, PTFE (polytetrafluoroethylene) may be used.

Preferably, the desiccant component may be a compound that has a humidity absorbing function, especially a chemical that chemically absorbs humidity and maintains to be in a solid state even after the absorption. For example, this desiccant component may be a metal oxide, an inorganic acid salt, an organic acid salt, or the like. In the present embodiment, it is especially preferred that at least one of alkaline earth metal oxide and sulfic acid salt is used. The alkaline earth metal oxide may be, for example, calcium oxide (CaO), barium oxide (BaO), magnesium oxide (MgO), or the like. The sulfate salt may be, for example, lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), nickel sulfate ($NiSO_4$), or the like. Besides, an organic material having moisture absorbability may be used, too.

The coating film 7 is formed on the substrate 1, directly at least on the second electrode 6, thereby coating the light-emitting part 50. The coating film 7 according to the present embodiment coats the entire substrate 1, the first electrode 2, the organic layer 5 and the second electrode 6. This coating film 7 functions as buffer layer against the contact object. Specifically, the coating film 7 is made of an amorphous organic material, and has a film thickness (D7) that absorbs surface irregularities of the contact object contacted by the surface of this coating film 7.

The amorphous organic material may be an organic material that can be formed by a deposition that does not damage the organic layer 5 or the second electrode 6 during the film formation. Furthermore, this organic material may be a material that becomes amorphous during the film formation, such as N,N'-di(naphthalene-1-yl)-N,N'-diphenyl-benzine (NPB), almino-quinolinol complex ($Alq_3$), and so on.

The coating film 7 may include a moisture absorbing component in the amorphous organic material. By including a moisture absorption component in the coating film 7, problems such as deterioration of the luminescence characteristics of the organic EL element can be reduced. In the case of an organic EL panel provided with a cathode separator as mentioned below, the influence of the outgas emitted from this cathode separator may be reduced by a moisture absorbing component of the coating film 7.

As moisture absorbing component (absorbent) in the coating film 7, anhydrous salt of chloride, sulfide, oxide, etc. of an alkali metal, or an alkali earth metal (anhysodium (Na), potassium (K), calcium (Ca), magnesium (Mg), etc.), or the like may be used. For example, anhydrous magnesium sulfate, anhydrous sodium sulfate, calcium chloride, lithium chloride, calcium oxide, vanadium oxide, strontium oxide, or the like may be used.

As sealing structure, there are a hollow sealing that seals the organic EL element coated with the coating film inside the sealing space M, and a solid sealing that seals the organic EL element coated with the coating film 7 without providing a sealing space.

The organic EL panel 10 according to one embodiment shown in FIG. 1(A) and FIG. 2(A) is an example of the hollow sealing, and the contact object according to one embodiment of the present invention of the coating film is the desiccant 81. The thickness 7D of this coating film 7 (thickness in the vertical direction of the substrate 1) is, for example, larger than, preferably more than 1.5 times as large as, the grain size of the desiccant which is the desiccant component of the desiccant 81, or the peak-to-valley length at the surface of the desiccant 81 (the length of the convex part 811).

Especially in the case of a thin organic EL panel, the thickness 7D of the coating film 7 is preferably approximately 1.5 to 4 times, most preferably approximately 3 times, as large as the grain size of the desiccant 81, or the peak-to-valley length at the surface of the desiccant 81 (length of convex part 811).

The thickness 7D of the coating film 7 (thickness in the vertical direction of the substrate 1) is, for example, the length from the surface of the coating film 7 to the light-emitting part 50, specifically the length from the surface of the coating film 7 to the upper part of the second electrode 6.

The thickness 7D of this coating film 7 becomes larger according to the deposition time in a case of manufacturing the coating film 7 by a deposition method. Therefore, data associated between the deposition time measured in advance and the thickness 7D (deposition time—thickness calculation table) is used to conduct the deposition for the predetermined deposition time to form the film thickness that absorbs the surface irregularities of the contact object, for example, to form the coating film 7 according to the present invention.

In the organic EL panel 10 of the above configuration, the coating film 7 has a film thickness 7D that absorbs the surface irregularities of the desiccant 81. Therefore, even if the sealing member 80 is deformed in a concave form by an external force and the sheet-shaped desiccant 81 contacts the coating film 7, the desiccant 81 and the surface of the organic EL element can be prevented from contacting each other. In addition, the mechanical damage to the organic EL element can be restrained.

Specifically, as shown in FIG. 2(A) for example, the sheet-shaped desiccant 81 includes a desiccant component made of a binder resin and an inorganic material, the desiccant component contacts the coating film 7, the inorganic material has a convex part 811 formed on the surface of the sheet-shaped desiccant 811, and the surface of the coating film 7 has a concave part formed by the convex part, therefore the desiccant 81 and the surface of the organic EL element can be prevented from contacting each other.

The organic EL panel 10A according to the second embodiment shown in FIG. 1(A) and FIG. 2(B) is an example of the solid sealing, where the contact object according to one embodiment of the present invention of the coating film 7 is a sealing adhesive 82.

The sealing adhesive 82 according to the second embodiment corresponds to the sheet-shaped desiccant of the first embodiment and is formed of a resin or the like. A foreign substance or the like adsorbed on the surface of the sealing adhesive 82 forms the convex part 811. On the surface of the coating film 7, a concave part 701 is formed in a form matching the convex part 821 of the sealing adhesive 82, the convex part 821 and concave part 701 fitting each other. In another example, the sealing adhesive 82 includes an inorganic filler of a binder resin and an inorganic material, and this desiccant component contacts the coating film 7. Specifically, a convex part 821 is formed by a particle of the inorganic material of the inorganic filler or the desiccant component on the surface of the sealed desiccant 82. On the surface of the coating film 7, a concave part 701 is formed in a form matching the convex part 821 of the sealing adhesive 82, the convex part 821 and concave part 701 fitting each other. Such a fitting structure of the convex part 82 and the concave part 701 may comparatively easily be made by a deposition manufacturing method.

As mentioned above, the organic EL panel 10A according to the second embodiment may be formed thinner for the absence of the sealing space M in comparison to the organic EL panel according to the first embodiment, for example, and further more has a comparatively high strength.

Also, the coating film 7 has a film thickness 7D that absorbs the surface irregularities of the desiccant 81. Therefore, even if the sealing member 80 is deformed in a concave form by an external force, the desiccant 81 and the surface of the organic EL element can be prevented from contacting each other, and the internal stress can be dispersed in the coating film. Therefore, the mechanical damage to the organic EL element can be restrained.

Figure 3A:
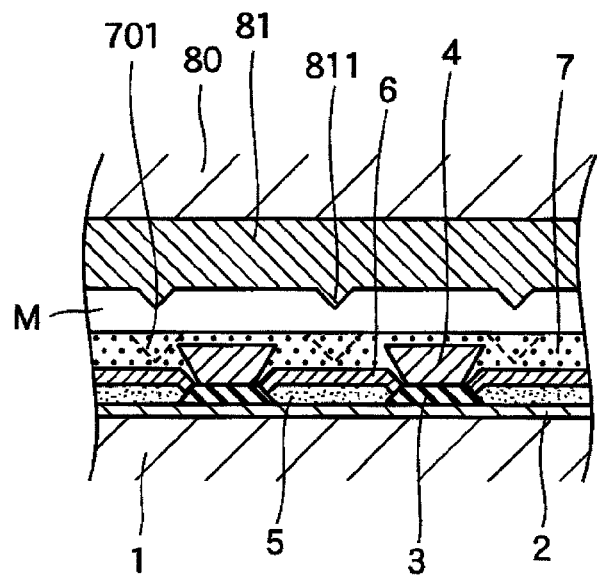
FIG. 3(A) is a cross-sectional view of an organic EL panel 10C according to the third embodiment of the present invention.

FIG. 3(A) is a cross-sectional view of an organic EL panel 10C according to the third embodiment of the present invention. For the identical parts of the first and second embodiments, the identical references are not repeated for explanations.

In the organic EL pane 10C according to the third embodiment of the present invention, a cathode separator 4 is formed on an insulating layer 3.

A plurality of cathode separators 4 are formed in parallel so as to cross the first electrode 2 on the insulating layer 3 (in a stripe shape along the direction vertical to the paper in the example of the drawing), and have a cross section in an inverted trapezoid shape. This inverted trapezoid shape may be such that the width of the upper surface of the cathode separator 4 is larger than the width of the lower surface on the insulating film layer 3, including a T-shape. The side surface of the cathode separator 4 may be flat, slightly curved, or bended to be formed in a T-type.

The coating film 7 is formed to a thickness so as to cover the cathode separator 4, as shown in FIG. 3(A). The thickness from the upper part of the coating film 7 to the second electrode 6 is only required to be larger than the length of the convex part 811 of the desiccant 81. Preferably, the thickness from the upper part of the coating film 7 to the upper part of the cathode separator 4 is larger than the length of the convex part 811 of the desiccant 81.

Specifically, for example, if the thickness of the cathode separator 4 is approximately 3 µm, the thickness of the coating film 7 may be the same, or approximately 3 µm, and flush to the cathode separator 4, or larger, so as to function as a buffer layer.

In the organic EL panel 10C of the above configuration, even if the sealing member 80 is deformed in a concave form by an external force, the desiccant 81 and the surface of the organic EL element can be prevented from contacting each other, and the internal stress (??) can be dispersed in the coating film. Therefore, the mechanical damage to the organic EL element can be restrained.

Figure 3B:
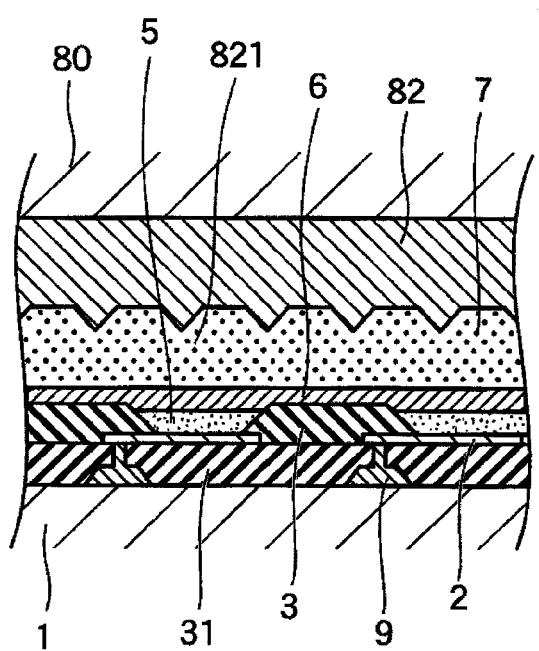
FIG. 3(B) is a cross-sectional view of an organic EL panel 10D according to the fourth embodiment of the present invention.

FIG. 3(B) is a cross-sectional view of an organic EL panel 10D according to the fourth embodiment of the present invention. For the identical parts of the first and second embodiments, the identical references are not repeated for explanations.

The organic EL panel according to the first to third embodiments is a passive-matrix type. However, the present invention may be applied to an active-matrix organic EL panel, as shown in FIG. 3(B).

Specifically, in the organic EL panel 10D according to the fourth embodiment, a thin film transistor (TFT) 9 is formed on the substrate 1 in a matrix shape for each pixel. On the TFT 9, a flattened insulating layer 31 is formed, on which a first electrode 2 is formed to be electrically connected to the TFT 9. On the first electrode 2, an organic layer 5 is formed. On this organic layer 5, a second electrode 6 is formed. On this second electrode 6, the coating film 7 is formed to a predetermined thickness. Other configurations are not explained as the configurations are substantially the same as the passive type organic EL panel according to the third embodiment.

In the organic EL panel 10D of the above configuration, even if the sealing member 80 is deformed in a concave form by an external force, the sealing adhesive 82 and the surface of the organic EL element can be prevented from contacting each other, and the internal stress can be dispersed in the coating film. Therefore, the mechanical damage to the organic EL element can be restrained.

Figure 4:
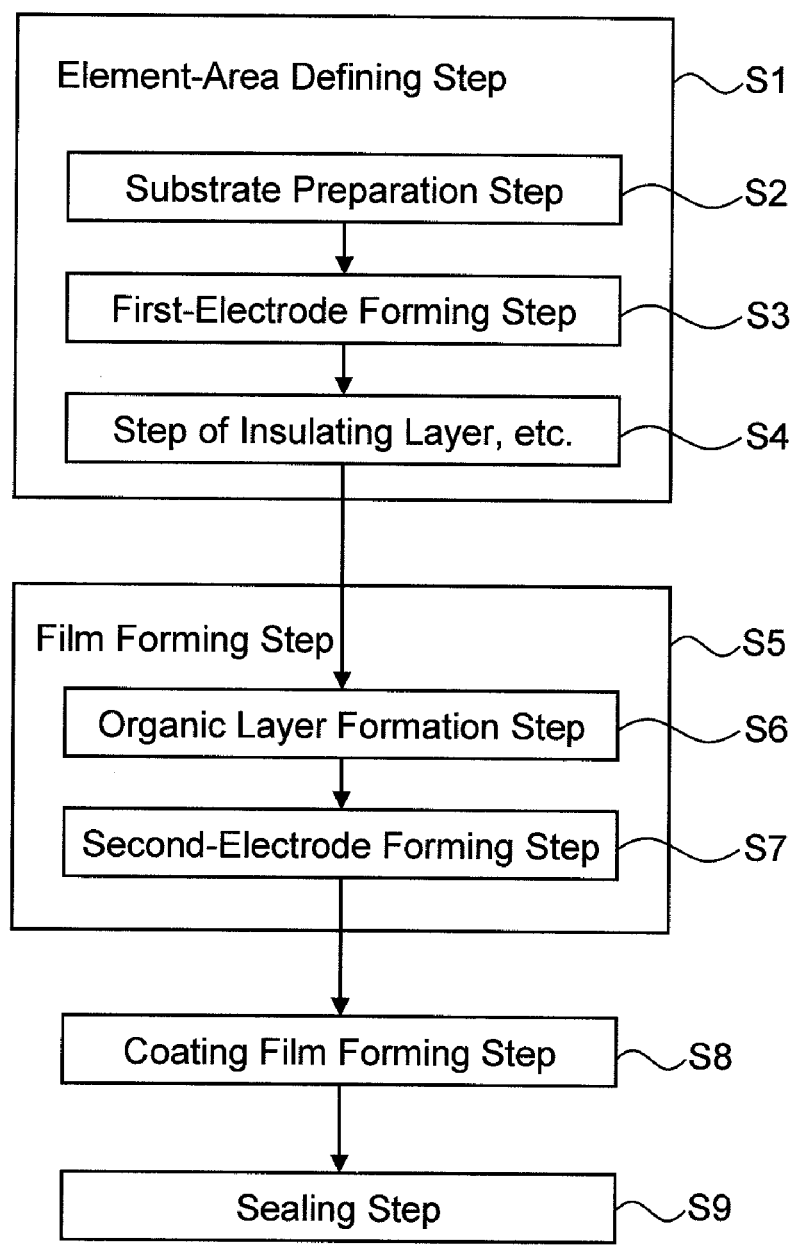
FIG. 4 is a flowchart explaining a manufacturing method of an organic EL panel according to one embodiment of the present invention.
Figure 5:
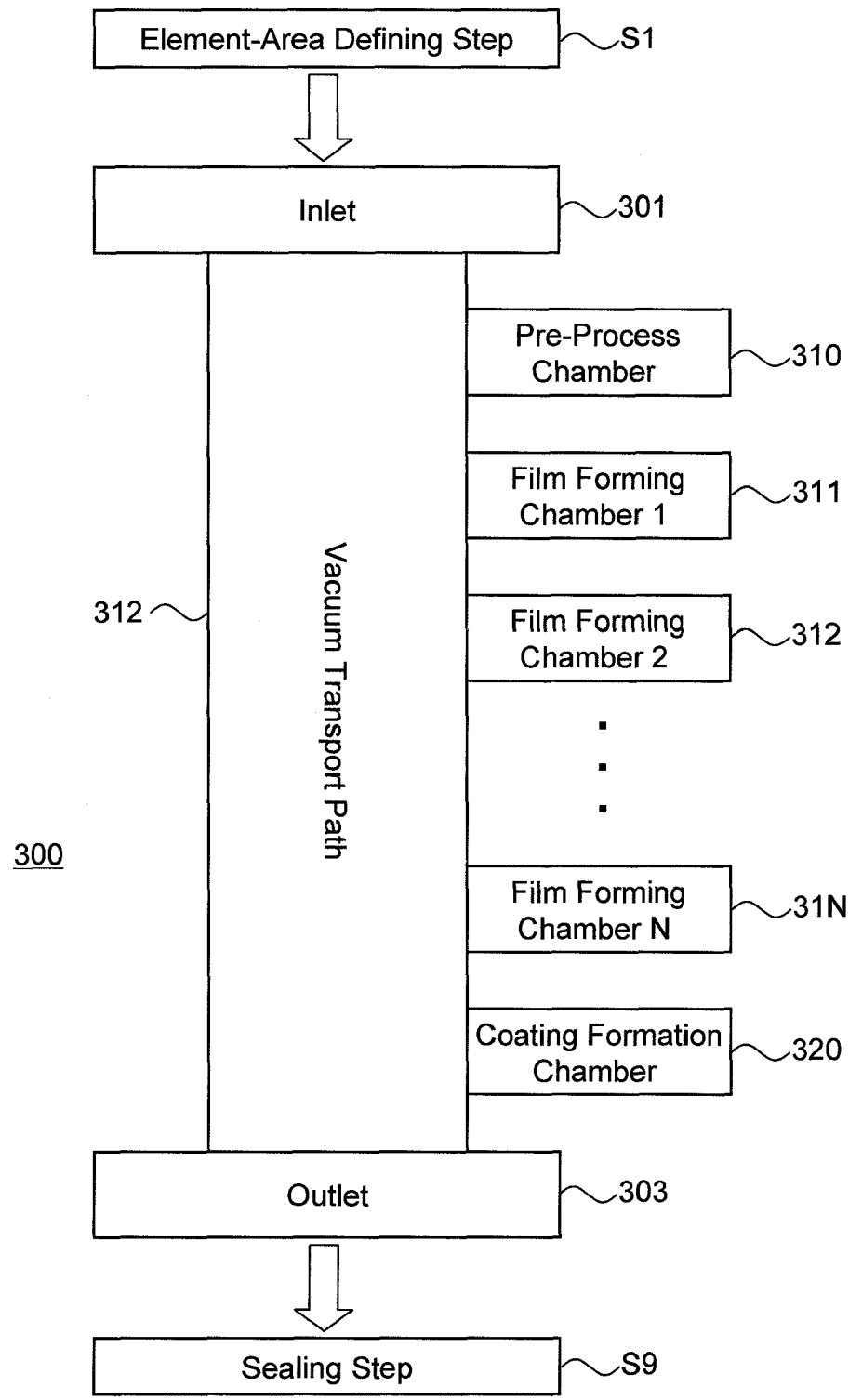
FIG. 5 explains a manufacturing apparatus of an organic EL panel, according to one embodiment of the present invention.

FIG. 4 is a flowchart explaining a method for manufacturing method of an organic EL panel according to one embodiment of the present invention. FIG. 5 explains a manufacturing apparatus of an organic EL panel, according to one embodiment of the present invention.

The method for manufacturing the organic EL panel according to the present invention includes an element-area defining step (S1), a film forming step (S5), and a coating film forming step (S8) and a sealing step (S9).

The element-area defining step (S1) is to form the first electrode 2 on the substrate directly or via another layer, and define the element area on the electrode 2. Specifically, after conducting the substrate preparation step S2 including the polishing, cleaning, etc. of the substrate, the first-electrode forming step (S3) to form the first electrode 2 is conducted. In the first-electrode forming step (S3), specifically, the electrode material of the first electrode 2 is formed on the substrate by a thin film forming technique such as deposition, puttering, etc., and is subsequently formed in a stripe pattern by a pattern formation technique such as photolithography. After the pattern formation, cleaning and drying steps are carried out if necessary.

In a step of insulating layer, etc. (S4), an organic insulating material such as polyimide, etc., or an inorganic insulating material such as $SiO_2$, SiN, etc., is used to form the first electrode 2 a pattern, followed by forming. Specifically, when using an organic insulating material such as polyimide, etc., a film of a predetermined thickness is formed on the substrate on which the first electrode 2 is formed, by a spin-coat method, or the like. Then, an exposure process is carried out using an exposure mask having an opening pattern to form the light-emitting part. Subsequently, a development process is conducted to form an insulating layer 3 having the above-mentioned grid pattern. When using an inorganic material to form the insulating layer, a film is formed by deposition, sputtering, or the like. Then, the above-mentioned grid pattern is obtained by a pattern formation technique such as photolithography, etc.

If a cathode separator is formed, a cathode separator 4 is formed in a stripe shape on the insulating layer 3. The shape and pattern of the cathode separator 4 may be formed by photolithography. Specifically, a photopolymer applied to a predetermined thickness is irradiated with light through a photomask having an opening of a stripe pattern crossing with the first electrode 2. Then, the difference in development speed due to the exposure amount in the film thickness direction is used to form the cathode separator 4 in an inverted trapezoid shape in the cross section.

In the film forming step (S5), an organic layer 5, including the light-emitting layer, on the first electrode 2 with a defined element area is formed in vacuo. Then, the second electrode 6 is formed on this organic layer 5. Specifically, in an organic layer formation step (S6), after the first electrode 2, the insulating layer 3, etc. are formed on the substrate 1, each of the organic layers are formed on the substrate 1, thereby forming the organic layer 5 at least on the exposed part of the first electrode 2. For dividing different colors to the respective light-emitting layer and other function layers, a mask with an opening corresponding to the positions of the formation of the light-emitting part of a certain color is used. For film formation of each color, either masks are changed, or one mask is used by displacing it. Each layer of the organic layer 5 is formed by a vacuum deposition.

Each layer of the organic layer 5 may be formed by painting. Subsequently, in the second-electrode forming step (S7), the organic layer 5 is formed, then an electrode material is used to form the second electrode 6. In this instance, the cathode separator functions as shadow mask, and the second electrode 6 is formed in a stripe shape between the cathode separators 4.

In the coating-film forming step (S8), a material for film formation including a moisture absorbent and an amorphous organic material is used to form the coating film 7 coating the light-emitting part in the film forming step such as deposition, etc. In this coating-film forming step (S8), the coating film 7 is formed without breaking vacuum from the film forming step inside the manufacturing apparatus 300, to a thickness that absorbs the surface irregularities of the contact object contacted by the surface of this coating film.

Specifically, the manufacturing apparatus 300 is configured to have a vacuum transport path 302 between an inlet 301 and an outlet 303. The vacuum transport path 302 is configured to have connection to pre-process chamber 310, a film forming chamber 1 (311), a film forming chamber 2(312), . . . , a film forming chamber N(31N), and a coating-formation chamber 320.

A substrate 1 on which a first electrode 2 and an insulating layer 3 are formed in the element-area defining step is transported from the inlet 301 into the manufacturing apparatus 300. As being transported via the vacuum transport path 30 through the pre-process chamber 310, the film forming chamber 1 (311), the film forming chamber 2 (312), . . . , the film forming chamber N (31N), and the coating-formation chamber 320, one after another, an organic layer 5, a second electrode 6 and a coating film 7 are formed without breaking vacuum. Then, it is transported out of the outlet 303 and the sealing step (S9) is conducted.

In the coating film forming step (S8), as mentioned above, data associated between the deposition time measured in advance and the thickness 7D (deposition time—thickness calculation table) is used to conduct the deposition for the predetermined deposition time in the coating-formation chamber 320 corresponding to the film thickness that absorbs the surface irregularities of the contact object, for example, to form the coating film 7 according to the present invention.

In the sealing step (S9) of sealing the light-emitting part, as mentioned above, a hollow sealing that seals the organic EL element coated with the coating film inside the sealing space M, a solid sealing that seals the organic EL element coated with the coating film 7 without providing a sealing space, or the like may be conducted. Specifically, in the sealing step (S9), the substrate 1 may be bonded with a sealing member housing a sheet-shaped desiccant on the inner surface via an adhesive layer surrounding the light-emitting part. In the sealing step (S9), the light-emitting part may be covered with a sealing member via a sealing adhesive covering said light-emitting part As explained above, in the method for manufacturing the organic EL panel according to one embodiment of the present invention, in this coating film forming step (S8), the coating film 7 is formed without breaking vacuum from the film forming step inside the manufacturing apparatus 300, to a thickness that absorbs the surface irregularities of the contact object contacted by the surface of this coating film. Therefore, adsorption of dusts, etc. between the coating film and the organic EL element can be reduced during the manufacturing step. Accordingly, the mechanical damage to the organic EL element due to dusts, etc. adsorbed during the manufacturing step can be prevented.

Figure 6:
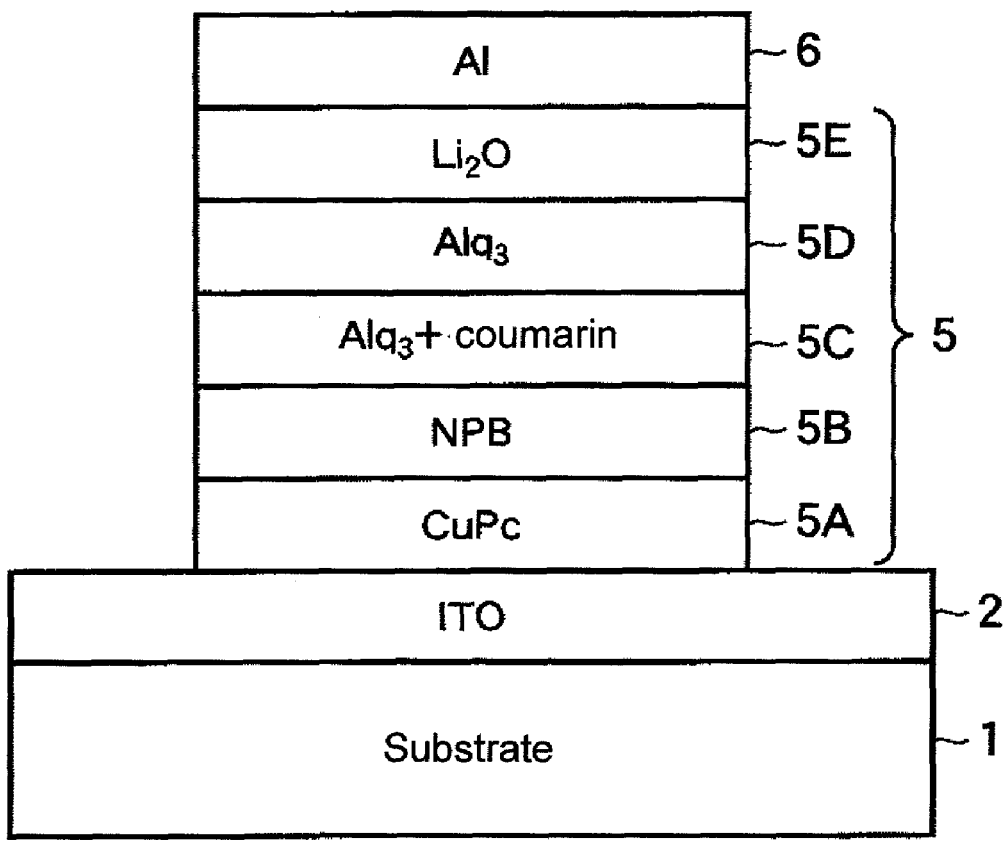
FIG. 6 explains an organic EL element according to one example of the present invention.

FIG. 6 explains an organic EL element 500E according to one example of the present invention.

The organic EL element 500E according to one example of the present invention has an element structure as shown in FIG. 6. An ITO thin film is formed on a substrate 1 of glass by a film forming method such as deposition, sputtering, etc. followed by a pattern formation by photolithography or the like to form the first electrode 2. An organic layer 5 is formed on the first electrode 2 by forming 30 nm of CuPc as hole-injection layer 5A, 30 nm of N,N'-di(naphthalene-1-yl)-N,N'-diphenyl benzene (NPB) as hole transport layer 5B, 30 nm of $Alq_3$ doped with 0.6 w % of coumarin as light-emitting layer 5C, 30 nm of $Alq_3$ as electron transport layer 5D, and 1 nm of $Li_2O$ as electron injection layer 5E, respectively, by a vacuum deposition method. The second electrode 6 is formed by deposition of Al to a predetermined thickness.

In place of the above configuration materials, the substrate 1 may be a plastic substrate; the first electrode 2 may be IZO, an electrically conducting material (PE-DOT:PSS) including poly(3,4)-ethylenedioxythiophene (PE-DOT) and polystyrenesulfonate (PSS); the hole-injection layer 5A may be tetraphenyl diaminodiphenyl (TPD), diphenyl naphtyl diamine (α-NPD), poly(p-phenylene vinylene) (PPV); the dopant of the light-emitting layer 5C may be perylene, tetraphenyl butadiene (TPB); the electron transport layer 5D may be (4-biphenyl) (4-t-butyl phenyl) oxadiazole (PDB),1,2,4-triazole derivative (TAZ); the electron injection layer 5 may be LiF, the second electrode may be MgAg, AlLi, and so on.

The organic EL element is not limited to the above-mentioned examples but the materials may be appropriately changed. Also, the present invention is not limited to the above embodiments. Moreover, the sealing structure is not limited to the above embodiments.

Next, organic EL elements (organic EL panel) according to specific examples of the present invention will be explained.

EXAMPLE 1

On a glass substrate of 0.4 mm in thickness, an organic EL panel 10 with an organic EL element 500E of the element structure shown in FIG. 6 formed as light-emitting element is formed. On the organic EL element, a coating film 7 is formed to a thickness of 6 μm by codeposition of calcium oxide (CaO) doped with almino-quinolinol complex ($Alq_3$) at a proportion of 80:20. The coating film 7 so formed includes $Alq_3$ as amorphous organic material and CaO as moisture absorbing component. In this case, the organic EL element and the coating film 7 are formed without breaking vacuum. A stainless steel sealing member of 0.2 mm in thickness is sealingly bonded to the substrate 1 by adhesive 90 made of UV-curable epoxy resin. A sheet desiccant 81 is formed in the sealing space M where calcium oxide (CaO) of 1.5~4 μm in grain size is formed as desiccant component and PTFE (polytetrafluoroethylene) is formed as binder resin. CaO included in the sheet desiccant 81 projects at the surface to form a convex part 811. This organic EL panel is called Example 1. Example 1 corresponds to the example of the organic EL panel shown in FIG. 1(A) and FIG. 2(A).

The coating layer 7 of Example 1 having a film thickness of 1 μm is called Comparative Example 1, whereas one without the coating layer 7 is called Comparative Example 2.

Figure 7:
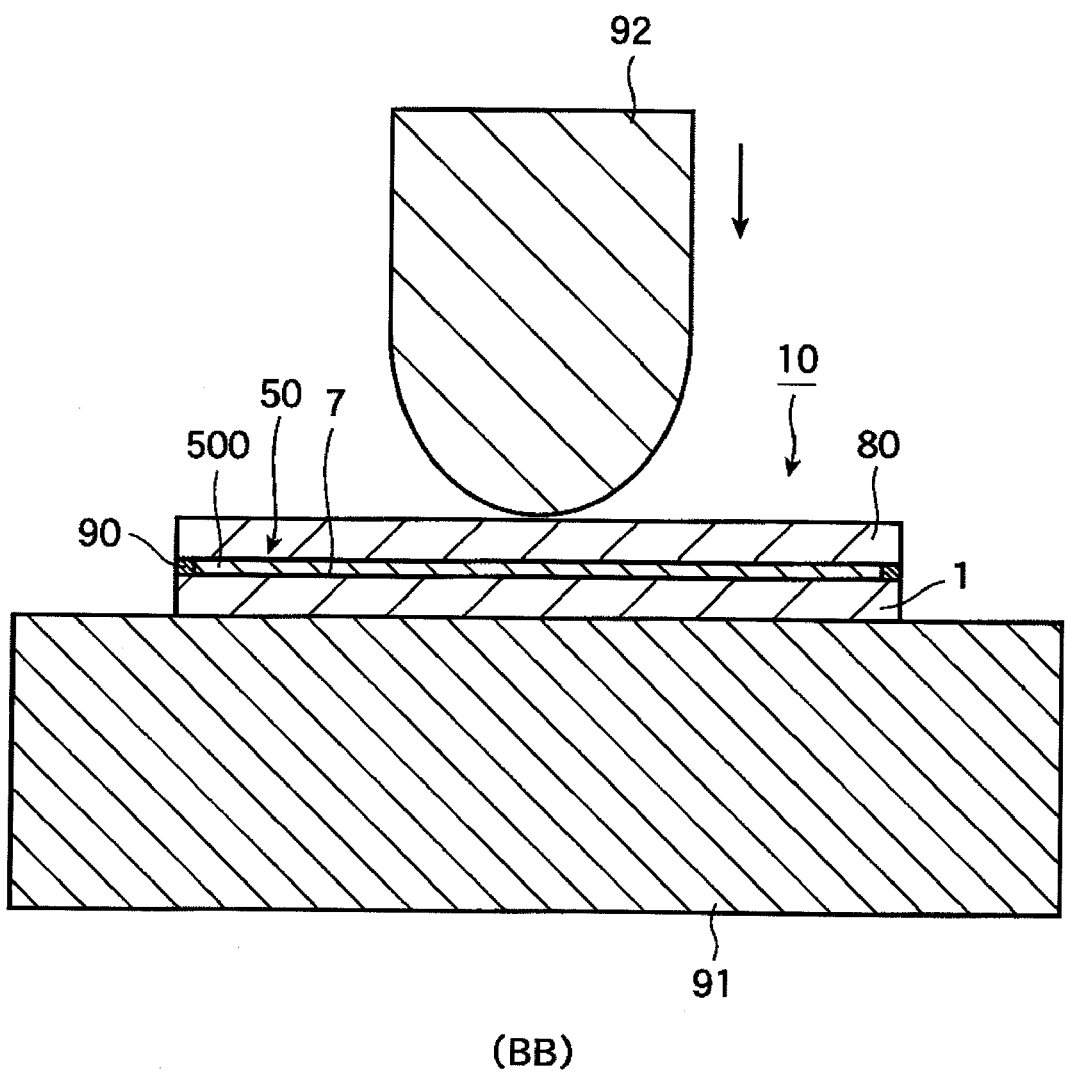
FIG. 7 explains an effect of the organic EL panel according to the present invention.

As described below, surface push strength tests were carried out on the organic EL panels according to Example 1, and Comparative Examples 1 and 2. Specifically, a push bar 92 with a curved surface part R formed at the tip (=radius of curvature 10 mm) is pushed onto the center of the backside of the organic EL panel arranged on a stage 91, and light-emitting status was observed. The bottom side of the panel of FIG. 7 corresponds to the bottom side of the display surface). The tests were carried out in 3 steps according to the load of push bar 92, 25 N, 50N and 100 N were used for the texts. The results of the tests are shown in Table 1. Evaluation for normal light emission: good (marked O), while Evaluation for abnormal light emission: not good (marked X).

TABLE 1

| LOAD | 25 N | 50 N | 100 N |
|---|---|---|---|
| Example 1 (coating layer 6: 6 μm) | O | O | O |
| Comparative Example 1 (coating layer 6: 1 μm) | O | O | X |

TABLE 1-continued

| LOAD | 25 N | 50 N | 100 N |
|---|---|---|---|
| Comparative Example 2 (without coating layer 6) | O | X | X |

The grain size of CaO in the sheet desiccant 81 is 1.5~4 μm. In an example of a coating film 6 formed to be 1.5 times as thick as the convex part 811 formed on the sheet desiccant 81, or thicker, an organic EL panel showing a normal luminescence even with an applied load of 100 N.

EXAMPLE 2

In Example 2, an organic EL panel is made in the same manner as the above Example 1 until forming the coating layer 6 without breaking vacuum. Next, a glass 0.7 mm-thick sealing member 80A and a substrate 1 were sealingly bonded with a sealing adhesive 82 including, as organic filler, silicon oxide ($SiO_2$) of 2~6 μm in grain size in the resin binder. SiO included in the sealing adhesive 82 fits the convex part 821 by forming a concave part 701. In Example 2, the mechanical strength of the organic EL panel is increased from Example 1 with space sealing, exhibiting normal luminescence in a surface push test. However, since the organic EL element and the resin binder are configured to be in contact, a luminescent defect such as leak, etc. may be caused.

In Example 2, the coating layer 6 of the film thickness set at 1, 3 and 6 μm is compared with a comparative example of an organic EL panel without a coating layer 6. Example 2 corresponds to one example of the organic EL panel shown in FIG. 1(B) and FIG. 2(B). Table 2 shows the results of the leak occurrence observed after sealing. If a leak does not occur, then the evaluation is good (marked O). If a leak occurs, then the evaluation is not good (marked X).

TABLE 2

| | Leak occurrence |
|---|---|
| Example 2 (coating layer 6: 6 μm) | O |
| Example 2 (coating layer 6: 3 μm) | O |
| Example 2 (coating layer 6: 1 μm) | O |
| Comparative Example (without coating layer) | X (100% occurred) |

As explained above, the organic EL panel according to the present invention is an organic EL panel that includes a light-emitting part including one or a plurality of organic EL elements on a substrate and having a sealing structure sealing the light-emitting part, wherein the organic EL element includes a light-emitting part, includes an organic layer 5 formed on a first electrode 2 formed directly, or via another layer, on the substrate 1, and a second electrode 6 formed on the organic layer 5, and includes a coating film 7 coating the light-emitting part is formed on the substrate 1, directly at least on said second electrode 6; the coating film 7 is made of an amorphous organic material and has a thickness (7D) absorbing a surface irregularity of the contact object contacted by the surface of the coating film 7. Therefore, the coating film 7 can reduce the mechanical damage to the organic EL element by the surface irregularities of the contact object (desiccant 81, sealing adhesive 82) contacted by the surface of the coating film 7. In other words, the coating film 7 functions as stress buffer layer. In addition, the mechanical damage can also be reduced to a comparatively thin organic EL panel, for example. Furthermore, when including a moisture absorbing component in the coating film 7 and selecting a desiccant as the object, moisture absorbing components are arranged both on the organic EL element and the object on the sealing substrate side, allowing the good luminescence characteristic of the organic EL panel to be maintained.

In a solid sealing panel structure being a panel structure where the adhesive and the organic EL element are configured to be directly in contact, a sufficient water absorbing function can be maintained by the desiccant. In a solid sealing structure including a moisture absorbing component in the coating film 7 and a desiccant in the sealing adhesive as the object, moisture absorbing components are arranged both on the organic EL element and the object on the sealing substrate side, allowing the good luminescence characteristic of the organic EL panel to be maintained.

The invention claimed is:

1. An organic EL panel comprising a light-emitting part including one or a plurality of organic EL elements on a substrate and having a sealing structure sealing the light-emitting part, wherein
said organic EL element includes a light-emitting layer, and includes an organic layer formed on a first electrode formed directly, or via another layer, on said substrate, and a second electrode formed on the organic layer,
said organic EL panel includes a coating film coating said light-emitting part and is formed on said substrate, directly at least on said second electrode,
said sealing structure is formed by bonding said substrate and a sealing member via an adhesive layer surrounding said light-emitting part,
a sheet-shaped desiccant or a sealing adhesive is arranged on an inner surface of said sealing member,
said sheet-shaped desiccant or said sealing adhesive includes a desiccant component made of a binder resin and an inorganic material,
said desiccant component contacts said coating film,
said inorganic material has a convex part formed on the surface of said sheet-shaped desiccant or said sealing adhesive,
the surface of said coating film has a concave part formed by said convex part, and
said coating film is made of an amorphous organic material and is formed to have a thickness larger than the length of said convex part.

2. The organic EL panel according to claim 1, wherein said coating film includes a moisture absorbing component in said amorphous organic material.

3. A method for manufacturing an organic EL panel comprising a light-emitting part including one or a plurality of organic EL elements on a substrate and having a sealing structure sealing the light-emitting part, comprising:
an element-area defining step of forming a first electrode directly, or via another layer, on said substrate and defining an element area on the first electrode;
a film forming step of forming an organic layer including a light-emitting layer on the first electrode on which the element area is defined and forming a second electrode on the organic layer, in vacuo;
a coating-film forming step of forming a coating film coating said light-emitting part made of an amorphous organic material, on said substrate; and
a sealing step of sealing said light-emitting part, wherein said sealing step includes bonding said substrate and a sealing member having a sheet-shaped desiccant or a sealing adhesive arranged on the inner surface via an adhesive layer surrounding said light-emitting part, said sheet-shaped desiccant or said sealing adhesive includes a desiccant component made of a binder resin and an inorganic material, said desiccant component contacts said coating film, said inorganic material has a convex part formed on the surface of said sheet-shaped desiccant or said sealing adhesive, and the surface of said coating film contacted by said desiccant has a concave part formed by said convex part, said coating-film forming step includes forming said coating film to a thickness larger than the length of said convex part of said sheet-shaped desiccant contacted by a surface of said coating film, without breaking vacuum from said film forming step.

4. The method for manufacturing an organic EL panel according to claim 3, wherein said coating film includes a moisture absorbing component in said amorphous organic material.

* * * * *